(12) United States Patent
Sylvia et al.

(10) Patent No.: US 7,172,450 B1
(45) Date of Patent: Feb. 6, 2007

(54) HIGH TEMPERATURE OPEN ENDED ZERO INSERTION FORCE (ZIF) TEST SOCKET

(75) Inventors: Robert James Sylvia, Santa Clara, CA (US); Adalberto M. Ramirez, Hayward, CA (US); Jens Ullmann, Los Gatos, CA (US); Jose Ysaguirre, Soquel, CA (US); Peter P. Cuevas, Los Gatos, CA (US); Maurice C. Evans, Oakland, CA (US)

(73) Assignee: Qualitau, Inc., Santa Clara, CA (US)

( * ) Notice: Subject to any disclaimer, the term of this patent is extended or adjusted under 35 U.S.C. 154(b) by 0 days.

(21) Appl. No.: 11/306,797

(22) Filed: Jan. 11, 2006

(51) Int. Cl.
*H01R 4/50* (2006.01)
*H01R 13/625* (2006.01)
*H01R 12/00* (2006.01)
*H05K 1/00* (2006.01)

(52) U.S. Cl. ..................... 439/342; 439/912
(58) Field of Classification Search .......... 439/70, 439/71, 259–270, 342, 912
See application file for complete search history.

(56) References Cited

U.S. PATENT DOCUMENTS

| | | | | |
|---|---|---|---|---|
| 4,478,472 A | * | 10/1984 | Baar | 439/296 |
| 6,168,449 B1 | * | 1/2001 | Huang et al. | 439/259 |
| 6,179,640 B1 | | 1/2001 | Sikora et al. | |
| 6,229,320 B1 | * | 5/2001 | Haseyama et al. | 324/754 |
| 6,565,373 B2 | * | 5/2003 | Cuevas | 439/266 |
| 6,896,561 B2 | * | 5/2005 | Lai | 439/862 |
| 6,953,347 B2 | * | 10/2005 | McGrath et al. | 439/66 |

* cited by examiner

*Primary Examiner*—James R. Harvey
(74) *Attorney, Agent, or Firm*—Beyer Weaver & Thomas LLP

(57) ABSTRACT

A socket for use in testing packaged integrated circuits having leads depending therefrom includes a first member for receiving the integrated circuit package and having a plurality of holes for receiving leads extending from the package. A second member has a plurality of wire contacts for engaging the leads, the first and second members being arranged to permit relative lateral translation thereof. A support frame includes a first portion which physically engages the first member and a second portion which physically engages the second member. A lever or handle is attached to the second portion and includes a cam surface for engaging a cam follower on the first portion for imparting relative lateral motion between the two members whereby the package leads physically engage wires of the second member.

13 Claims, 3 Drawing Sheets

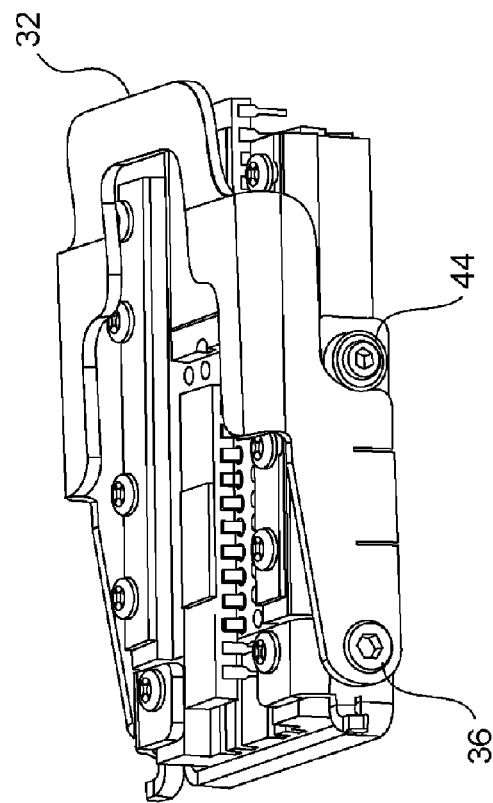
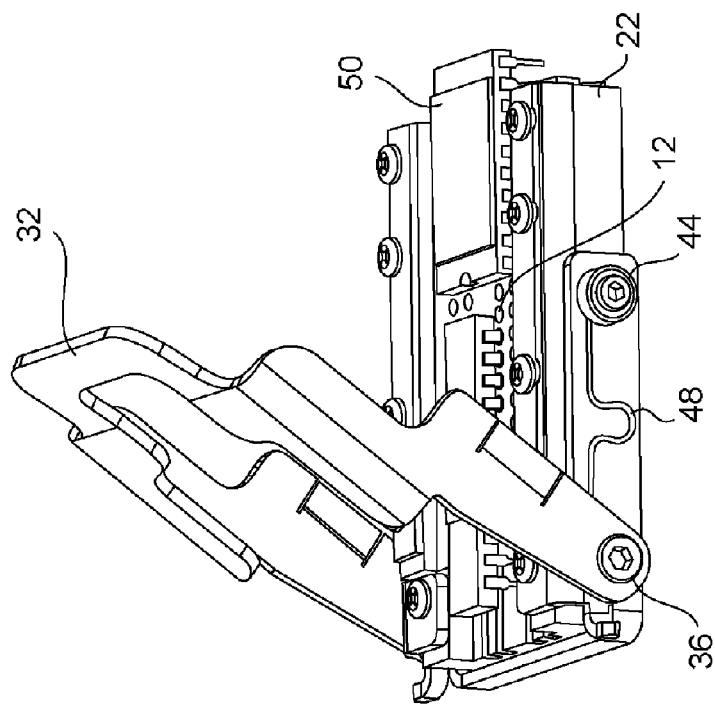
Fig. 2
Fig. 1

HIGH TEMPERATURE OPEN ENDED ZERO INSERTION FORCE (ZIF) TEST SOCKET

BACKGROUND OF INVENTION

This invention relates generally to the testing of electrical integrated circuits, and more particularly the invention relates to sockets for receiving packaged integrated circuits for test purposes.

The packaged integrated circuit typically includes a polymer or ceramic housing for a semiconductor chip with electrical leads extending from the package, which are electrically connected to the semiconductor chip. In a dual in-line package (DIP), the electrical leads are arranged in two parallel rows with the leads depending from the bottom of the housing.

Disclosed in U.S. Pat. No. 6,179,640 is a test socket which includes at least two members having planar surfaces arranged to permit relative lateral movement between the two members. One member is a package support and has a plurality of holes extending therethrough for receiving the integrated circuit package leads. Each hole has sufficient size to receive a lead with minimal or no force. The second member is a contact support and has a plurality of contacts arranged to be in spaced juxtaposition with package leads when a package is inserted into or removed from the support member. The contacts are slidable into engagement with the package leads after the package is inserted.

In a preferred embodiment, the plurality of contacts comprise wires positioned in grooves in the second member with the grooves arranged in alignment with the holes in the first member. The two members are joined by linear translation device such as a cam mechanism whereby the two planar surfaces can be translated laterally for engaging and disengaging the package leads with the wire contacts.

While the test socket has proved successful for use in testing packaged integrated circuits, the present invention is directed to an improved test socket.

SUMMARY OF INVENTION

The test socket in accordance with the invention has open ends to permit the insertion of packaged devices with different widths and pin counts. Moreover, different packaged devices can be placed in series (front to back) for simultaneous test.

The socket includes a support frame for two plates with sliding guides to permit relative sliding between the two plates of the socket. Preferably, the frame is metallic and the plates are ceramic.

A top plate has holes for receiving leads of a packaged device, and a bottom plate has contacts such as wires, which are engaged by leads after a device is mounted on the top plate and the two plates are slid relative to each other.

The actuator for sliding a plate includes a larger lever or handle which reduces physical force needed for engaging leads and contacts. In a preferred embodiment, a bearing is provided at the lever locking point to reduce or eliminate material friction and degradation.

The invention and objects and features thereof will be more readily apparent from the following detailed description and appended claims when taken with the drawings.

BRIEF DESCRIPTION OF DRAWINGS

FIG. 1 is a perspective view of a test socket in accordance with one embodiment of the invention in an open position for receiving or for discharging two packaged devices for test.

FIG. 2 is a perspective view of the test socket of FIG. 1 in a closed position for device testing.

DETAILED DESCRIPTION

Figure 3:
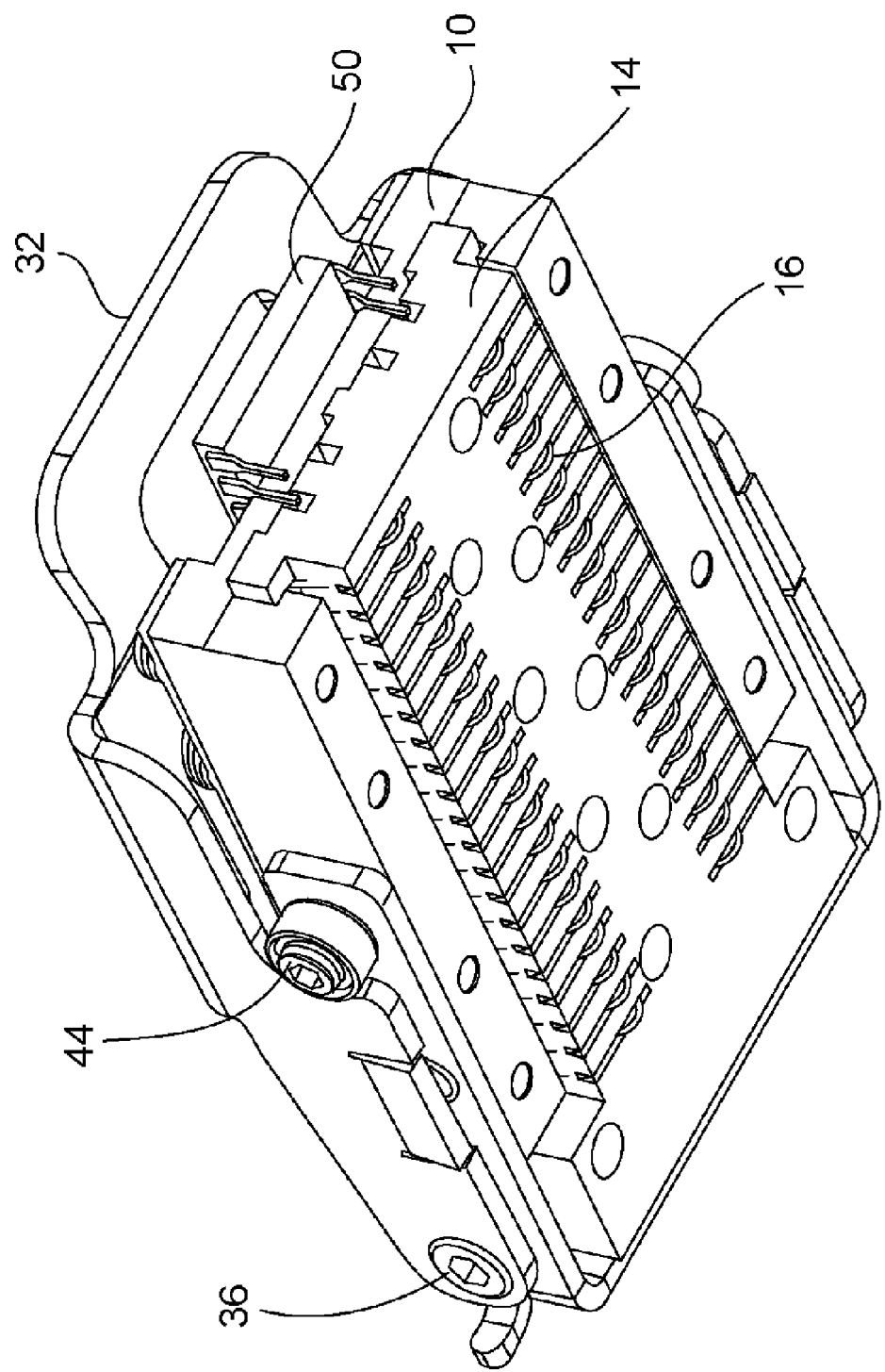
FIG. 3 is a bottom perspective view illustrating the frame with sliding guides which permit relative sliding between a bottom plate with wire contacts and a top plate for supporting the test devices in the test socket of FIG. 1.
Figure 4:
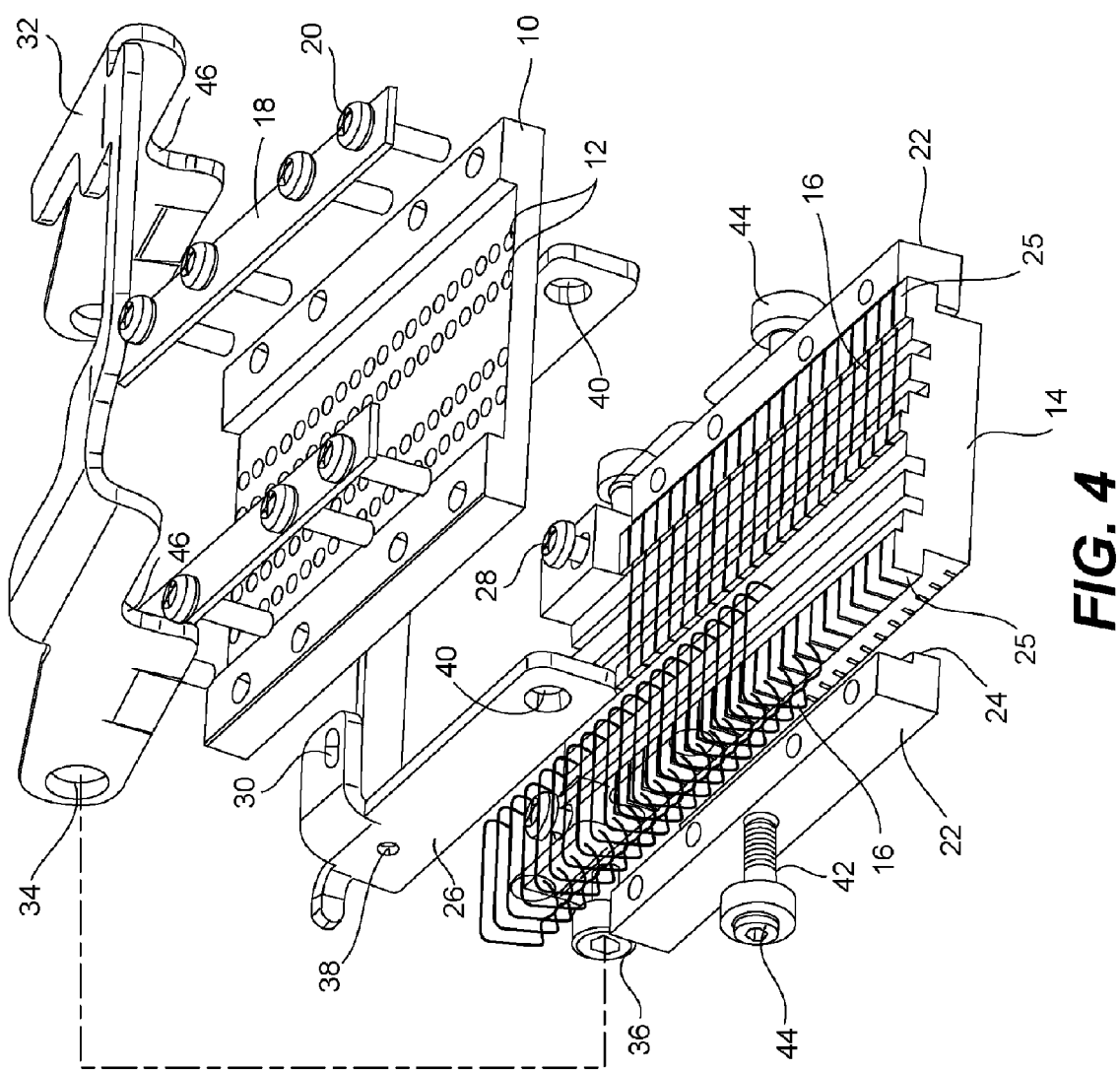
FIG. 4 is an exploded perspective view of the test socket of FIG. 1.

FIGS. 1–3 are perspective views of a test socket in accordance with one embodiment of the invention in an open position for receiving or for discharging two packaged devices for test, in a closed position for device testing, and a bottom perspective view of the closed position, respectively. FIG. 4 is an exploded perspective view of the test socket of FIG. 1.

Consider now FIG. 4 which is the exploded perspective view of the test socket for holding devices under test (DUT) such as dual in-line lead integrated circuit packages (DIP). The socket includes an upper plate 10 having a plurality of holes 12 for receiving leads of a DIP. The holes are arranged in a plurality of rows to accommodate DIPs of different widths. A bottom plate 14 includes a plurality of wires 16, which in operation are interconnected with test apparatus with the wires contacting leads of the DIP. The wires are positioned across grooves in plate 14 which accommodate leads extending through upper plate 10.

In preferred embodiments plates 10 and 14 can be ceramic and are mounted on a metallic frame of the test socket. Bars 18 and screws 20 fasten top plate 10 to parallel rails 22 of the support frame, the rails 22 including flanges 24 which define sliding guides or flanges 24 which receive flanges 25 of bottom plate 14. Frame 26 is fastened to bottom plate 14 by screws 28 which extend through hole 30 in frame 26.

A handle or lever 32 includes holes 34 which sit on pivot bearings 36 fastened to bottom plate 14. A slot 40 in frame 26 is mounted on shaft 42 fastened to rail 22 and allows a lateral movement of rails 22 relative to frame 26. A cam follower bearing 44 is mounted on shaft 42 for laterally translating rails 22 when engaged by cam surface 46 of handle 32.

The socket provides a longer and wider actuation lever or handle, which significantly reduces the distal force needed by a user to actuate the handle in order to engage (close or open) the socket during use. The cam follower bearing 44 is provided as the lever locking point to eliminate material friction and degradation during each use.

In operation, the bottom plate can be directly mounted or secured to a receiving printed circuit board with several strategically placed screws. The discreet contact wires in the bottom plate can contact exposed contact pads of the printed circuit board when the socket is mounted to the board. The top plate 10 receives the DUT and is moved laterally as the lever or handle is actuated which presses the DUT pins against corresponding contact wires. This action creates an electrical contact for the DUT to the socket contact wires.

FIG. 1 shows the test socket with handle 32 in an open position for receiving or discharging DUTs 50. A kickback spring 48 is provided between the shaft of the cam follower bearing 44 and the shaft for pivot bearing 36 to force the upper plate 10 to return to a fully open position for receiving or discharging a DUT, thus not needing the user to manually move the bottom plate into an open position.

It will be noted that the socket is open ended for extended package size acceptance. Each of the rows of receptacle holes in the top plate is uninterrupted (contiguous) to both ends of the socket top plate. This unique feature for a ZIF socket allows any 300 or 600 mil width packaged devices, regardless of their pin count, to be tested on this socket. It also allows for different packaged devices to be placed in series, front to back, for simultaneous test as illustrated in FIG. 1. The packaged devices could also be mounted side by side, but in this embodiment this would be limited to 300 mil width packages. This is to be contrasted with the conventional ZIF socket design which accommodate package sizes up to the pin count that the sockets are designed for. Extended or extra long package sizes are not accommodated in the conventional design.

FIG. 2 shows the socket of FIG. 1 in a closed position handle 32 and cam surface 46 engaging cam follower bearing 44 and moving top plate 10 laterally with the DUT leads engaging contact wires of the socket.

FIG. 3 is a bottom view of the test socket in the closed position of FIG. 2.

The metallic frame and plate sliding guides of the test socket in accordance with the invention minimizes the risk of breakage of the socket ceramic components or plates due to mechanical stresses at high temperature and user handling. Previous designs have been susceptible to breakage and warping of ceramic parts due to high temperature stresses and from user handling. Further, the new actuation mechanism does not rely on components or materials that may degrade over time during use at high temperatures, and therefore cause socket failure due to open electrical contacts from the socket contact wires to the pins of the packaged IC device under test. Previous designs have relied on a spring mechanism to maintain the necessary pressure between the socket contact wires and the DUT pins while in test at high temperatures.

While the invention has been described with reference to a specific embodiment, the description is illustrative of the invention and is not to be construed as limiting the invention. Various modifications and applications may occur to those skilled in the art without departing from the true spirit and scope of the invention as defined by the appended claims.

What is claimed is:

1. A socket for use in testing a packaged integrated circuit device having a plurality of leads extending therefrom, said socket comprising:
    a) a first member for receiving an integrated circuit package and having a plurality of holes for receiving leads extending from the package,
    b) a second member having a plurality of wire contacts for engaging the leads, the first and second members being arranged to permit relative lateral translation thereof,
    c) a support frame for the first and second members and including guides for permitting relative lateral motion between the first and second members from a device load/unload position where device leads do not engage the wires to a device test position where device leads engage the wires, the support frame further including a first portion physically engaging the first member, a second portion physically engaging the second member, the lever being pivotally attached to one portion of the first portion and second portion and contacting the other portion to impart the relative lateral motion between the first member and the second member, and
    d) a lateral translation lever pivotally attached to the support frame for imparting relative lateral motion between the first and second members.

2. The socket as defined by claim 1 wherein the one portion is the second portion.

3. The socket as defined by claim 2 wherein the first portion of the frame includes two rails, to which the first member is attached, the rails defining guides for slidably receiving the second member.

4. The socket as defined by claim 3 wherein the lever has cam surfaces, and the two rails have cam followers which are engaged by the cam surfaces when imparting relative lateral motion between the first member and the second member.

5. The socket as defined by claim 4 wherein the first and second members are ceramic plates.

6. The socket as defined by claim 5 wherein the support frame is metal.

7. The socket as defined by claim 4 wherein the support frame is metal.

8. The socket as defined by claim 4 and including bearings as the cam followers.

9. The socket as defined by claim 4 wherein opposing ends of the socket are open to permit insertion of packages of varying length and varying number of leads.

10. The socket as defined by claim 9 wherein a plurality of packaged devices can be inserted.

11. The socket as defined by claim 4 and further including a spring connected between the first portion and the second portion of the support frame which urges the first portion of the frame to return to an open position when the cam follower is not engaged.

12. The socket as defined by claim 1 wherein the wires of the second member are configured to electrically engage electrical leads on a printed circuit board on which the socket can be mounted.

13. The socket as defined by claim 1 wherein the holes in the first member are arranged in parallel rows for receiving leads from a dual in-line integrated circuit package.

* * * * *